(12) United States Patent
Lee et al.

(10) Patent No.: US 10,084,018 B2
(45) Date of Patent: *Sep. 25, 2018

(54) IMAGE SENSOR AND ELECTRONIC DEVICE INCLUDING THE SAME

(71) Applicant: Samsung Electronics Co., Ltd., Suwon-si, Gyeonggi-do (KR)

(72) Inventors: Gae Hwang Lee, Seongnam-si (KR); Kwang Hee Lee, Yongin-si (KR); Dong-Seok Leem, Hwaseong-si (KR); Yong Wan Jin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/374,550

(22) Filed: Dec. 9, 2016

(65) Prior Publication Data

US 2017/0125485 A1 May 4, 2017

Related U.S. Application Data

(63) Continuation of application No. 14/631,438, filed on Feb. 25, 2015, now Pat. No. 9,548,337.

(30) Foreign Application Priority Data

Sep. 30, 2014 (KR) .................. 10-2014-0131051

(51) Int. Cl.
*H01L 27/30* (2006.01)
*H01L 51/44* (2006.01)
*H01L 27/146* (2006.01)

(52) U.S. Cl.
CPC ...... *H01L 27/307* (2013.01); *H01L 27/14625* (2013.01); *H01L 27/14632* (2013.01); *H01L 27/14647* (2013.01); *H01L 51/441* (2013.01)

(58) Field of Classification Search
CPC ......... H01L 21/02532; H01L 21/02603; H01L 21/283; H01L 27/14625; H01L 27/14632;
(Continued)

(56) References Cited

U.S. PATENT DOCUMENTS 5,965,875 A * 10/1999 Merrill .............. H01L 27/14623
250/208.1
6,265,288 B1 * 7/2001 Okamoto .............. H01L 31/075
136/255
(Continued)

FOREIGN PATENT DOCUMENTS

EP 2770550 A1 8/2014
JP 5124934 B2 1/2013
(Continued)

OTHER PUBLICATIONS

European Search Report dated Mar. 2, 2016 issued in corresponding European Patent Application No. 15163656.0.
(Continued)

*Primary Examiner* — Allan R Wilson
(74) *Attorney, Agent, or Firm* — Harness, Dickey, & Pierce, P.L.C.

(57) ABSTRACT

An image sensor including a semiconductor substrate integrated with a plurality of photo-sensing devices and a nanopattern layer on the semiconductor substrate, the nanopattern layer having a plurality of nanopatterns, wherein each nanopattern of the plurality of nanopatterns correspond one to one with a single photo-sensing device of the plurality of photo-sensing devices, respectively.

25 Claims, 12 Drawing Sheets

(58) Field of Classification Search
CPC ............. H01L 27/14647; H01L 27/307; H01L 29/0653; H01L 29/0673; H01L 29/16; H01L 29/66553; H01L 29/78; H01L 51/441

See application file for complete search history.

(56) References Cited

U.S. PATENT DOCUMENTS

| | | | |
|---|---|---|---|
| 7,880,161 B2* | 2/2011 | Mears | .................... B82Y 20/00 |
| | | | 257/9 |
| 8,223,234 B2 | 7/2012 | Inuiya | |
| 8,227,755 B2* | 7/2012 | Fagan, III | ......... H01L 27/14625 |
| | | | 250/338.4 |
| 2005/0127463 A1 | 6/2005 | Yaung et al. | |
| 2009/0267494 A1 | 10/2009 | Lee et al. | |
| 2010/0176473 A1 | 7/2010 | Nishiwaki | |
| 2010/0214454 A1 | 8/2010 | Kikuchi | |
| 2011/0049661 A1 | 3/2011 | Maehara et al. | |
| 2011/0128423 A1 | 6/2011 | Lee et al. | |
| 2011/0164156 A1 | 7/2011 | Hiramoto et al. | |
| 2012/0161270 A1 | 6/2012 | Maehara et al. | |
| 2012/0248561 A1 | 10/2012 | Hakko | |
| 2012/0298846 A1 | 11/2012 | Nomura et al. | |
| 2013/0099343 A1 | 4/2013 | Toshikiyo et al. | |
| 2014/0021574 A1 | 1/2014 | Egawa | |
| 2014/0239278 A1 | 8/2014 | Park et al. | |
| 2014/0327783 A1* | 11/2014 | Nishiwaki | ................ H04N 5/33 |
| | | | 348/164 |
| 2015/0244958 A1 | 8/2015 | Ohguro et al. | |

FOREIGN PATENT DOCUMENTS

| | | |
|---|---|---|
| KR | 100889554 A | 2/2009 |
| KR | 100905230 A | 5/2009 |
| KR | 101385250 A | 6/2009 |

OTHER PUBLICATIONS

Extended European Search Report dated Jul. 5, 2016 issued in corresponding European Patent Application No. 15163656.0.

* cited by examiner

IMAGE SENSOR AND ELECTRONIC DEVICE INCLUDING THE SAME

CROSS REFERENCE TO RELATED APPLICATION

This application is a continuation application of U.S. patent application Ser. No. 14/631,438, filed on Feb. 25, 2015, which claims priority to and the benefit of Korean Patent Application No. 10-2014-0131051 filed in the Korean Intellectual Property Office on Sep. 30, 2014, the entire contents of each of which are incorporated herein by reference.

BACKGROUND

1. Field

Example embodiments relate to an image sensor and an electronic device including the same.

2. Description of the Related Art

A photoelectronic device converts light into an electrical signal using photoelectronic effects, and may include a photodiode and/or a phototransistor. The photoelectronic device may be applied to an image sensor and/or a solar cell.

An image sensor including a photodiode requires relatively high resolution and thus a relatively small pixel. At present, a silicon photodiode is widely used, but the silicon photodiode has a problem of deteriorated sensitivity and has a relatively small absorption area due to relatively small pixels.

On the other hand, a color filter selectively absorbs light in a given (or alternatively, predetermined) wavelength region in each pixel when light enters an image sensor. A red filter, a blue filter, and a green filter are respectively disposed on a red pixel, a blue pixel, and a green pixel and selectively absorb red, blue, and green light, and the selectively absorbed light may be transferred to a photodiode of each pixel.

However, the color filters may not only absorb light by themselves, and thus bring about loss of a relatively large amount of light delivered to the photodiode, but are also formed through a process of spin coating, UV exposure, and/or wet etching, and thus have a limitation of reducing the pixel size of an image sensor to less than or equal to a given (or alternatively, predetermined) size.

SUMMARY

Example embodiments provide an image sensor capable of increasing wavelength selectivity of each pixel, thus improving sensitivity and photo-efficiency as well as reducing the pixel size to less than or equal to a given (or alternatively, predetermined) size.

Example embodiments also provide an electronic device including the image sensor.

According to example embodiments, an image sensor includes a semiconductor substrate integrated with a plurality of photo-sensing devices, and a nanopattern layer on the semiconductor substrate and having a plurality of nanopatterns, wherein each nanopattern of the plurality of nanopatterns correspond one to one with a single photo-sensing device of the plurality of photo-sensing devices, respectively.

Each nanopattern of the plurality of nanopatterns may transmit light in a wavelength region sensed by the single photo-sensing device corresponding thereto.

Each nanopattern of the plurality of nanopatterns may have a size of greater than or equal to about 100 nanometers and less than about 1 micrometer.

The nanopattern layer may include at least two types of dielectric substances having different refractive indexes from each other.

The two types of dielectric substances may be formed in separate regions from each other, and each nanopattern of the plurality of nanopatterns may be defined at the interface between the two types of dielectric substances.

The two types of dielectric substances may have a refractive index difference of greater than or equal to about 0.2.

The nanopattern layer may have a thickness of less than about 1 micrometer.

The image sensor may further include an organic photoelectronic device on the nanopattern layer, the organic photoelectronic device including a first electrode and a second electrode facing each other, and an organic photoelectric conversion layer between the first electrode and the second electrode.

The plurality of photo-sensing devices integrated in the semiconductor substrate may include a first photo-sensing device configured to sense light in a first wavelength region, and a second photo-sensing device configured to sense light in a second wavelength region from the first wavelength region.

The organic photoelectric conversion layer may absorb light in a third wavelength region different from the first wavelength region and the second wavelength region.

The first photo-sensing device and the second photo-sensing device may be spaced apart from each other in a horizontal direction, and the size of the nanopattern corresponding to the first photo-sensing device may be different from the size of the nanopattern corresponding to the second photo-sensing device.

The nanopattern corresponding to the first photo-sensing device may selectively transmit light in a first wavelength region, and the nanopattern corresponding to the second photo-sensing device may selectively transmit light in a second wavelength region.

The first wavelength region may be a blue wavelength region, the second wavelength region may be a red wavelength region, and the third wavelength region may be a green wavelength region.

The red wavelength region may have a maximum absorption wavelength ($\lambda_{max}$) of greater than about 580 nanometers and less than or equal to about 700 nanometers, the blue wavelength region may have a maximum absorption wavelength ($\lambda_{max}$) of greater than or equal to about 400 nanometers and less than about 500 nanometers, and the green wavelength region may have a maximum absorption wavelength ($\lambda_{max}$) of about 500 nanometers to about 580 nanometers.

The first photo-sensing device and the second photo-sensing device may be positioned at different depths from the surface of the semiconductor substrate.

The first photo-sensing device may sense light in a longer wavelength region than the second photo-sensing device, and the first photo-sensing device may be further from the surface of the semiconductor substrate than the second photo-sensing device.

The first photo-sensing device and the second photo-sensing device may be sequentially stacked in a vertical direction.

The plurality of nanopatterns may selectively reflect light in the third wavelength region to the organic photoelectric conversion layer.

The image sensor may not include an organic color filter.

According to example embodiments, an electronic device includes the image sensor.

The organic photoelectric conversion layer may include a p-type semiconductor and an n-type semiconductor, and the p-type semiconductor and the n-type semiconductor may form a pn junction.

According to example embodiments, an image sensor includes a semiconductor substrate integrated with a plurality of photo-sensing devices, and a nanopattern layer on the semiconductor substrate, the nanopattern layer having a plurality of nanopatterns, wherein a single nanopattern of the plurality of nanopatterns corresponds to a single photo-sensing device of the plurality of photo-sensing devices, and wherein the single nanopattern and the single photo-sensing device have substantially a same width.

According to example embodiments, an image sensor includes a semiconductor substrate integrated with a plurality of photo-sensing devices, and a nanopattern layer on the semiconductor substrate, the nanopattern layer having a plurality of nanopatterns, wherein a single nanopattern of the plurality of nanopatterns corresponds to a single photo-sensing device of the plurality of photo-sensing devices, and wherein the nanopatterns include a dielectric substance.

According to example embodiments, an image sensor includes a semiconductor substrate integrated with a plurality of photo-sensing devices, and a nanopattern layer on the semiconductor substrate, the nanopattern layer having a plurality of nanopatterns, wherein a single nanopattern of the plurality of nanopatterns corresponds to a single photo-sensing device of the plurality of photo-sensing devices, and wherein the single nanopattern transmits light in a wavelength region sensed by the single photo-sensing device corresponding thereto.

Accordingly, an image sensor according to example embodiments may increase wavelength selectivity per pixel and thus improve sensitivity and photo-efficiency as well as reduce the pixel size to less than and equal to a given (or alternatively, predetermined) size.

DETAILED DESCRIPTION

Figure 1:
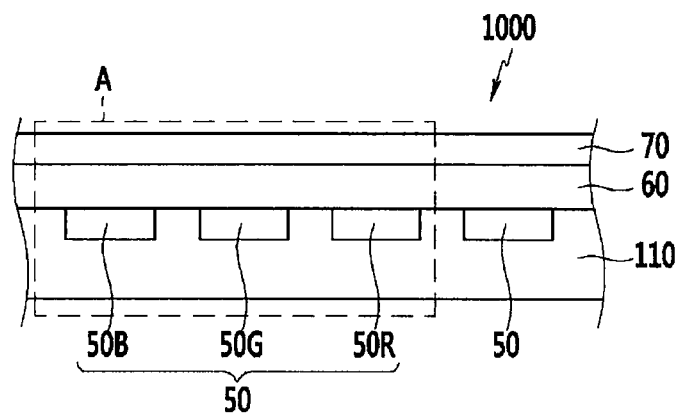
FIG. 1 is a cross-sectional view showing a CMOS image sensor according to example embodiments.

Example embodiments will hereinafter be described in detail, and may be more easily performed by those who have common knowledge in the related art. However, this disclosure may be embodied in many different forms, and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that when an element or layer is referred to as being "on," "connected to," "coupled to," or "covering" another element or layer, it may be directly on, connected to, coupled to, or covering the other element or layer, or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of the example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Referring to FIG. 1, a CMOS image sensor according to example embodiments will now be described.

FIG. 1 is a cross-sectional view showing a CMOS image sensor according to example embodiments.

Referring to FIG. 1, the CMOS image sensor 1000 according to example embodiments includes a semiconductor substrate 110 and a nanopattern layer 70 positioned on the semiconductor substrate 110.

The semiconductor substrate 110 may be a silicon substrate, for example, a monocrystalline silicon substrate. The semiconductor substrate 110 is integrated with a plurality of photo-sensing devices 50 and transmission transistor (not shown). The plurality of photo-sensing devices 50 may be photodiodes.

FIG. 1 shows a blue pixel, a green pixel, and a red pixel that are adjacent to each other, but it is not limited thereto. Hereinafter, a constituent element including "B" in the reference numeral refers to a constituent element included in the blue pixel, a constituent element including "G" in the reference numeral refers to a constituent element included in the green pixel, and a constituent element including "R" in the reference numeral refers to a constituent element included in the red pixel.

The photo-sensing device 50 and the transmission transistor may be integrated in each pixel, and for example, as shown in the drawing, the photo-sensing device 50 may include a photo-sensing device 50B of a blue pixel, a photo-sensing device 50G of a green pixel, and a photo-sensing device 50R of a red pixel. The photo-sensing device 50 senses light, and the information sensed by the photo-sensing device 50 may be transferred by the transmission transistor.

A metal wire (not shown) and a pad (not shown) are formed on the semiconductor substrate 110. In order to decrease signal delay, the metal wire and pad may be made of a metal having relatively low resistivity, for example, aluminum (Al), copper (Cu), silver (Ag), and alloys thereof, but are not limited thereto.

A lower insulation layer 60 is formed on the metal wire and the pad. The insulation layer 60 may be made of an inorganic insulating material (e.g., a silicon oxide and/or a silicon nitride), or a relatively low dielectric constant (low K) material (e.g., SiC, SiCOH, SiCO, and SiOF).

The lower insulation layer 60 has a trench (not shown) exposing the photo-sensing devices 50B, 50G, and 50R of each pixel. The trench may be filled with fillers.

The nanopattern layer 70 having a plurality of nanopatterns is formed on the insulation layer 60. Each single nanopattern included in the plurality of nanopatterns corresponds to a photo-sensing device 50R, 50G, and 50B in a one-to-one manner, and may include at least two types of dielectric substances having different refractive indexes. This will be illustrated referring to FIGS. 2 and 3.

Figure 2:
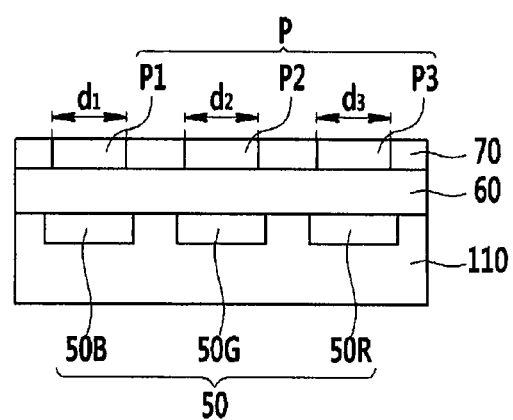
FIG. 2 is a cross-sectional view enlarging a region 'A' in FIG. 1.

FIG. 2 is a cross-sectional view enlarging a region 'A' in FIG. 1.

Referring to FIG. 2, the nanopattern layer 70 having a plurality of nanopatterns P is formed on the semiconductor substrate 110 in which a plurality of photo-sensing devices 50 are integrated. Each nanopattern P1, P2, and P3 corresponds to each photo-sensing device 50B, 50G, and 50R, and has substantially the same width as the corresponding photo-sensing devices 50B, 50G, and 50R.

The nanopattern P has a size of tens to hundreds of nanometers, and may have a similar size to, for example, that of a visible light wavelength region. Since the nanopattern having a similar size to that of the visible light wavelength region has higher coherency with visible light, and a transmitted wavelength region may be selected through shape control of the pattern, the nanopattern having a given (or alternatively, predetermined) size may selectively transmit a given (or alternatively, predetermined) wavelength region.

The nanopattern may have a size (d1, d2, and d3), for example, ranging from greater than or equal to about 1 nanometer to less than about 1 micrometer, greater than or equal to about 10 nanometers to less than about 1 micrometer, greater than or equal to about 100 nanometers and less than about 1 micrometer, or greater than or equal to about 150 nanometers to less than about 1 micrometer, but is not limited thereto. Herein, the size of the nanopattern indicates the longest horizontal length (width) that one nanopattern has in the cross-section of the nanopattern layer 70 when horizontally cut. For example, when the nanopattern has a circular ring shape, the pattern size is a diameter of an outer circle.

Figure 3:
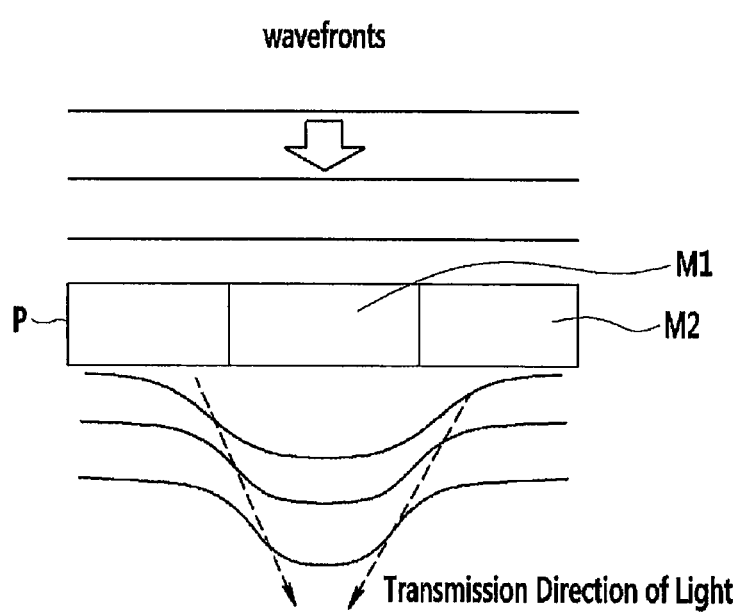
FIG. 3 is a reference view showing a principle that a wavelength in a particular region is selected through a nanopattern applied to an image sensor according to example embodiments.

FIG. 3 is a reference view showing a principle that a wavelength in a particular region is selected through a nanopattern applied to an image sensor according to example embodiments.

Referring to FIG. 3, wavefronts of incident light through the nanopattern P causes interference between two types of dielectric substances M1 and M2 consisting of the nanopattern P and having a different refractive index, and thus a wavelength in a particular region may pass the nanopattern (P). Herein, the dielectric substance indicates an insulator material becoming polarized in an electric field but not passing electricity, and for example, the two types of dielectric substances M1 and M2 may have a refractive index difference of greater than or equal to about 0.2.

Figure 4A:
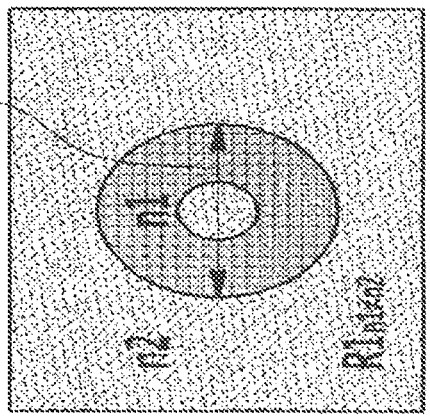
FIGS. 4(a)-4(c) is a top plan view prefiguratively showing various nanopatterns applied to an image sensor according to example embodiments.
Figure 4B:
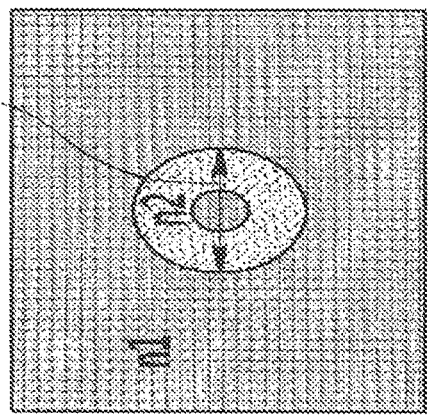
Figure 4C:
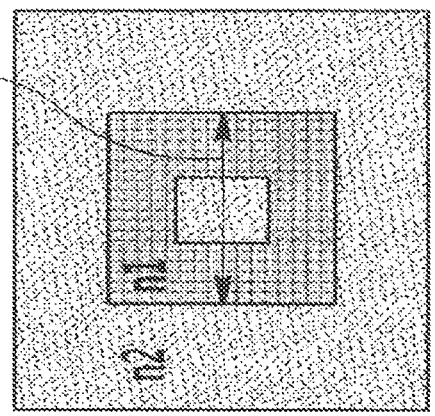

FIGS. 4(a)-4(c) is a top plan view prefiguratively showing various nanopatterns applied to an image sensor according to example embodiments.

A nanopattern P shown in FIGS. 4(a)-4(c) has a circular ring as shown in FIGS. 4(a) and 4(b) or a quadrangular ring as shown in FIG. 4(c), but the inventive concepts are not particularly limited to such a shape of a circle, a quadrangle, and a triangle. Referring to FIGS. 4(a)-4(c), the nanopattern (P) is defined by an interface between two types of dielectric substances having different refractive indexes n1 and n2. Referring to FIG. 4(a), a circular ring region consists of a dielectric substance having a refractive index n1, while outer and inner regions forming an interface with the ring consist of a dielectric substance having a refractive index n2, but the circular ring region may consist of a dielectric substance having a refractive index n1, while an outer region forming an interface with the ring consists of a dielectric substance having a refractive index n2, and an inner region forming an interface with the ring consists of a dielectric substance having a refractive index n3 (n1≠n2≠n3).

Figure 5:
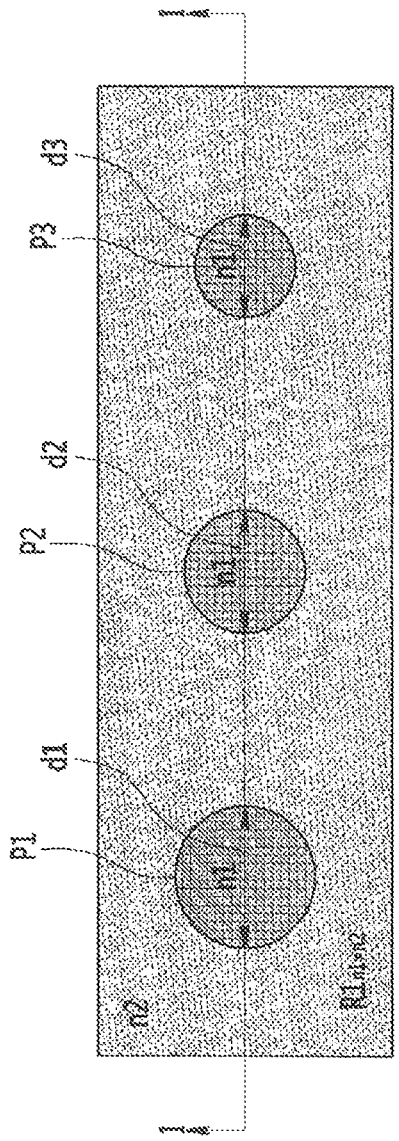
FIG. 5 is a top plan view showing one example of a nanopattern layer applied to an image sensor according to example embodiments.
Figure 6:
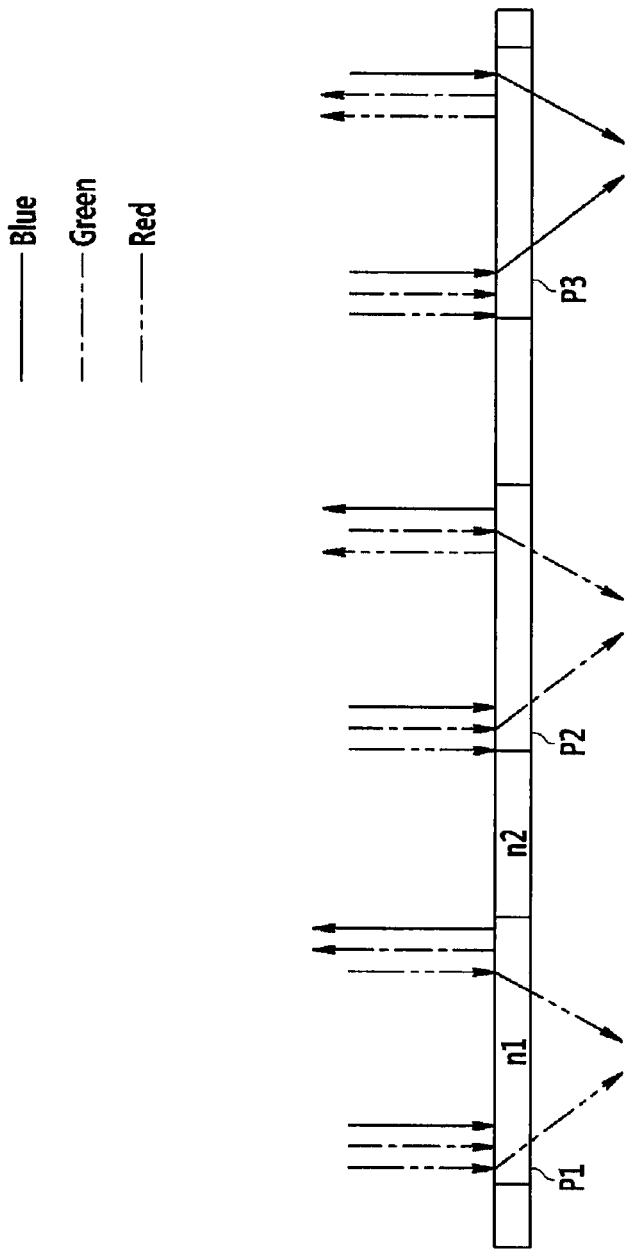
FIG. 6 is the cross-sectional view of the nanopattern layer cut along an I-I line in FIG. 5.

FIG. 5 is a top plan view showing one nanopattern layer applied to an image sensor according to example embodiments, and FIG. 6 is the cross-sectional view of the nanopattern layer cut along an I-I line in FIG. 5.

Referring to FIGS. 5 and 6, the nanopattern layer includes a plurality of nanopatterns P1, P2, and P3. The nanopattern layer includes two types of dielectric substances having different refractive indexes n1 and n2, and the two types of dielectric substances are positioned in different regions from each other. A plurality of nanopatterns may have the same or different sizes d1, d2, and d3 from one another. Referring to FIG. 6, a nanopattern having a given (or alternatively, predetermined) size may selectively pass a given (or alternatively, predetermined) wavelength region (e.g., blue, green, or red wavelength regions) out of a visible ray area, and thus the size d1, d2 or d3 of a nanopattern may be selected depending on a transmitted wavelength region. For example, the size d1, d2, and d3 of the nanopattern may each be independently in a range of less than about 1 micrometer, greater than or equal to about 10 nanometers and less than about 1 micrometer, greater than or equal to about 100 nanometers and less than about 1 micrometer, or greater than or equal to about 150 nanometers to less than about 1 micrometer.

The image sensor may have relatively high color separation characteristics without equipping a separate organic color filter layer, due to the nanopattern layer having a nanopattern of a given (or alternatively, predetermined) size. For example, an organic color filter layer having a relatively large thickness may be omitted by introducing a nanopattern layer having a thickness of greater than or equal to about 50 nanometers to less than about 1 micrometer or about 200 nanometers to about 500 nanometers, and thus, a pixel size may be reduced. In addition, the nanopattern layer has characteristics of focusing light and thus may secure characteristics of concentrating light without using separate microlens.

Hereinafter, an image sensor according to example embodiments is described.

Figure 7:
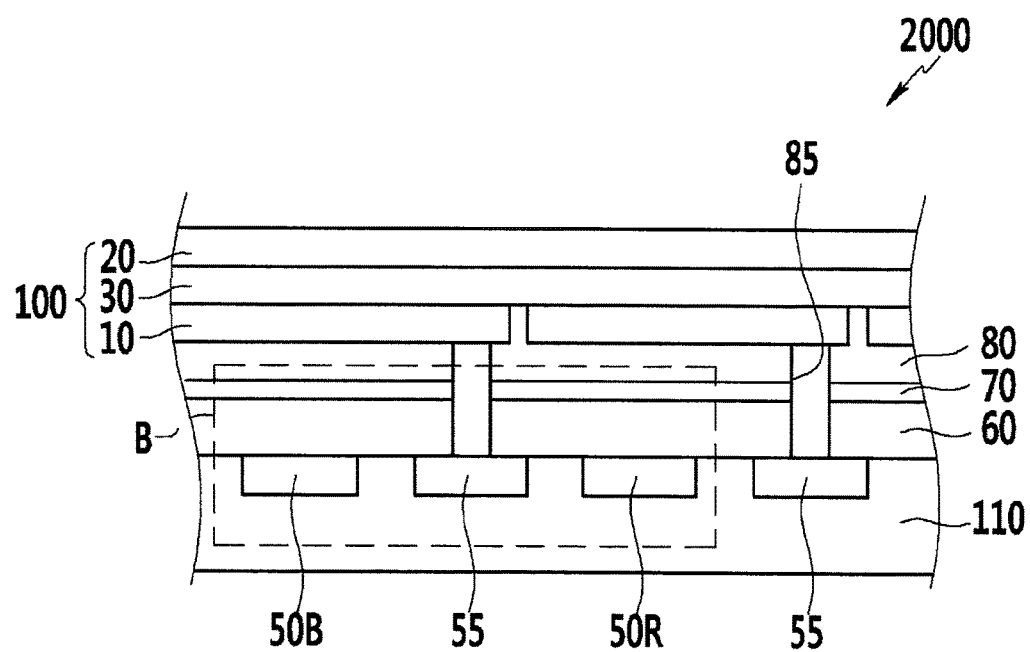
FIG. 7 is a cross-sectional view showing a CMOS image sensor according to example embodiments.

FIG. 7 is a cross-sectional view showing a CMOS image sensor according to example embodiments.

Referring to FIG. 7, the image sensor 2000 according to example embodiments includes a semiconductor substrate 110 and a nanopattern layer 70 positioned on the semiconductor substrate 110, like the example embodiment illustrated in FIG. 1.

The semiconductor substrate 110 may be a silicon substrate, for example, a monocrystalline silicon substrate. The semiconductor substrate 110 is integrated with a blue photo-sensing device 50B, a red photo-sensing device 50R, a charge storage device 55, and a transmission transistor (not shown). The blue photo-sensing device 50B and the red photo-sensing device 50R may be photodiodes.

The blue photo-sensing device 50B, the red photo-sensing device 50R, the transmission transistor, and/or the charge storage device 55 may be integrated in each pixel, and for example, as shown in the drawing, the blue photo-sensing device 50B may be included in a blue pixel and the red photo-sensing device 50R may be included in a red pixel. Even though the charge storage device 55 is drawn only in a green pixel, the blue pixel and the red pixel may respectively include a charge storage device connected with the blue photo-sensing device 50B and a charge storage device connected with the red photo-sensing device 50R.

The blue photo-sensing device 50B and the red photo-sensing device 50R sense light, the information sensed by the photo-sensing devices may be transferred by the transmission transistor, the charge storage device 55 of the green pixel is electrically connected with an organic photoelectronic device 100 that will be described later, and the information of the charge storage device 55 may be transferred by the transmission transistor.

A metal wire (not shown) and a pad (not shown) are formed on the semiconductor substrate 110. In order to decrease signal delay, the metal wire and pad may be made of a metal having relatively low resistivity, for example, aluminum (Al), copper (Cu), silver (Ag), and alloys thereof, but are not limited thereto. Further, it is not limited to the structure, and the metal wire and pad may be positioned under the photo-sensing devices 50B and 50R.

A lower insulation layer 60 is formed on the metal line and pad which is described like example embodiment illustrated in FIG. 6.

On the lower insulation layer 60, the nanopattern layer 70 having a plurality of nanopatterns is formed. A single nanopattern of the plurality of nanopatterns is positioned to correspond to a single photo-sensing device, for example, 50R and 50B, in a one-to-one manner. This will be illustrated referring to FIG. 8.

Figure 8:
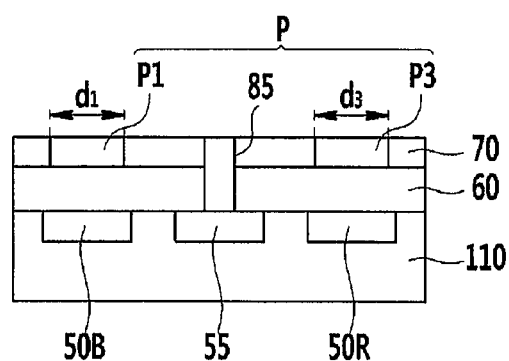
FIG. 8 is a cross-sectional view enlarging a region 'B' in FIG. 7.

FIG. 8 is a cross-sectional view enlarging a region 'B' in FIG. 7.

Referring to FIG. 8, the nanopattern layer 70 having a plurality of nanopatterns P is formed on a semiconductor substrate in which the plurality of photo-sensing devices 50B and 50R are integrated. Each nanopattern P1 and P3 are positioned to correspond to each photo-sensing device 50B and 50R.

As described above, the nanopattern (P) has a size of tens to hundreds of nanometers, for example, a similar size to that of a visible light wavelength region. The nanopattern having a similar size to that of a visible light wavelength region has relatively high coherency with visible light, and thus a transmitted wavelength region to pass through may be selected by controlling the shape of the pattern.

The size d1 and d3 of the nanopatterns may be controlled depending on a transmitted wavelength region for transmittance. The size d1 and d3 of the nanopattern may be, for example, in a range of greater than or equal to about 1 nanometer to less than about 1 micrometer, greater than or equal to about 10 nanometers to less than about 1 micrometer, greater than or equal to about 100 nanometers to less than about 1 micrometer, or greater than or equal to about 150 nanometers to less than about 1 micrometer, but is not limited thereto.

Referring to FIG. 7, an upper insulation layer 80 is formed on the nanopattern layer 70. The upper insulation layer 80 and the lower insulation layer 60 have a contact hole (not shown) exposing the pad and a through-hole 85 exposing the charge storage device 55 of the green pixel.

The organic photoelectronic device 100 is formed on the upper insulation layer 80.

The organic photoelectronic device 100 includes a first electrode 10 and a second electrode 20, and an organic photoelectric conversion layer 30 interposed between the first electrode 10 and the second electrode 20.

The organic photoelectric conversion layer 30 may include, for example, a p-type semiconductor and an n-type semiconductor, and the p-type semiconductor and the n-type semiconductor may form a pn junction. At least one of the p-type semiconductor and the n-type semiconductor selectively absorbs light in a green wavelength region to generate excitons, and then the generated excitons may be separated into holes and electrons to provide a photoelectronic effect.

The p-type semiconductor material may be, for example, quinacridone or a derivative thereof, or subphthalocyanine or a derivative thereof, and the n-type semiconductor material may be, for example, a cyanovinyl group-containing thiophene derivative, subphthalocyanine or a derivative thereof, or fullerene or a fullerene derivative, but are not limited thereto.

The organic photoelectric conversion layer 30 may be a single layer or a multilayer. The organic photoelectric conversion layer 30 may be, for example, an intrinsic layer (I layer), a p-type layer/I layer, an I layer/n-type layer, a p-type layer/I layer/n-type layer, and a p-type layer/n-type layer.

The intrinsic layer (I layer) may include the p-type semiconductor and the n-type semiconductor in a thickness ratio of about 1:100 to about 100:1. The semiconductors may be included in a thickness ratio ranging from about 1:50 to about 50:1 within the range, for example, about 1:10 to about 10:1, or about 1 to about 1. When the p-type and n-type semiconductors have a composition ratio within the range, an exciton may be effectively produced, and a pn junction may be effectively formed.

The p-type layer may include the p-type semiconductor, and the n-type layer may include the n-type semiconductor.

The organic photoelectric conversion layer 30 may have a thickness of about 1 nanometer to about 500 nanometers. Within the range, the organic photoelectric conversion layer 30 may have a thickness of about 5 nanometers to about 300 nanometers. When the organic photoelectric conversion layer 30 has a thickness within the range, the organic photoelectric conversion layer 30 may effectively absorb light, effectively separate holes from electrons, and deliver them, effectively improving photoelectric conversion efficiency.

The second electrode 20 may be positioned on the organic photoelectric conversion layer 30 and may be a light-transmitting electrode into which light enters. The second electrode 20 may be made of, for example, a transparent conductor (e.g., indium tin oxide (ITO) or indium zinc oxide (IZO)), and the second electrode 20 may be a metal thin layer having a relatively thin thickness of several nanometers or several tens of nanometers or a metal thin layer having a relatively thin thickness of several nanometers to several tens of nanometers doped with a metal oxide. One of the first electrode 10 and the second electrode 20 is an anode and the other is a cathode.

The first electrode 10, the organic photoelectric conversion layer 30, and the second electrode 20 provide an organic photoelectronic device 100, and when light is incident from the second electrode 20 and the organic photoelectric conversion layer 30 adsorbs light in a green wavelength region, excitons may be produced from the inside the organic photoelectronic device 100. The excitons are separated into holes and electrons in the organic photoelectric conversion layer 30, and the separated holes are transported to an anode that is one of the first electrode 10 and the second electrode 20, and the separated electrons are transported to the cathode that is the other of the first electrode 10 and the second electrode 20, so as to flow a current. The separated electrons or holes may be collected in the charge storage device 55. Light in other wavelength regions except for a green wavelength region passes the first electrode 110 and may be sensed by the blue photo-sensing device 50B or the red photo-sensing device 50R.

The organic photoelectronic device 100 may be formed on the front of the image sensor and absorb light thereon, and thus increase a light area and bring about relatively high light absorption efficiency.

As shown in FIGS. 7 and 8, the blue photo-sensing device 50B configured to sense light in a blue wavelength region and the red photo-sensing device 50R configured to sense light in a red wavelength region may be spaced apart from each other in a horizontal direction. When a nanopattern P1 corresponding to the blue photo-sensing device 50B has the same shape as that of a nanopattern P3 corresponding to the red photo-sensing device 50R, the size d1 of the nanopattern P1 corresponding to the blue photo-sensing device 50B may differ from the size d3 of the nanopattern P3 corresponding to the blue photo-sensing device 50R.

In FIG. 7, the blue photo-sensing device 50B configured to sense light in a blue wavelength region and the red photo-sensing device 50R configured to sense light in a red wavelength region are integrated in the semiconductor substrate 110, and the organic photoelectronic device 100 includes the organic photoelectric conversion layer 30 selectively absorbing light in a green wavelength region. However, the organic photoelectronic device 100 is not limited to the above structure shown in FIG. 1. A photo-sensing device configured to sense light in a blue wavelength region and a photo-sensing device configured to sense light in a green wavelength region may be integrated in the semiconductor substrate 110, and the organic photoelectronic device 100 may include an organic photoelectric conversion layer 30 selectively absorbing light in a red wavelength region. Alternatively, a photo-sensing device configured to sense light in a red wavelength region and a photo-sensing device configured to sense light in a green wavelength region may be integrated in the semiconductor substrate 110, and the organic photoelectronic device 100 may include an organic photoelectric conversion layer selectively absorbing light in a blue wavelength region.

Herein, the red wavelength region may have a maximum absorption wavelength ($\lambda_{max}$) of greater than about 580 nanometers and less than or equal to about 700 nanometers, the blue wavelength region may have a maximum absorption wavelength ($\lambda_{max}$) of greater than or equal to about 400 nanometers and less than about 500 nanometers, and the green wavelength region may have a maximum absorption wavelength ($\lambda_{max}$) of about 500 nanometers to about 580 nanometers.

The image sensor according to example embodiments includes the nanopattern layer having a nanopattern of a given (or alternatively, predetermined) size and thereby color separation characteristics are improved without equipping a separate organic color filter layer, like the above example embodiment illustrated in FIG. 7. In addition, since light in a green wavelength region is selectively reflected toward the organic photoelectric conversion layer 30 due to generation of interference according to introduction of the nanopattern layer 70, a green light absorption rate of the organic photoelectric conversion layer 30 may be further increased.

In the image sensor 2000 of FIGS. 7 and 8, the blue photo-sensing device 50B and the red photo-sensing device 50R are positioned at the same depth from the surface of the semiconductor substrate 110, but are not limited thereto, and the blue photo-sensing device 50B and the red photo-sensing device 50R may be positioned at a substantially different depth from the surface of the semiconductor substrate 110. For example, the red photo-sensing device 50R may be positioned further from the surface of the semiconductor substrate 110 than the blue photo-sensing device 50B.

Figure 9:
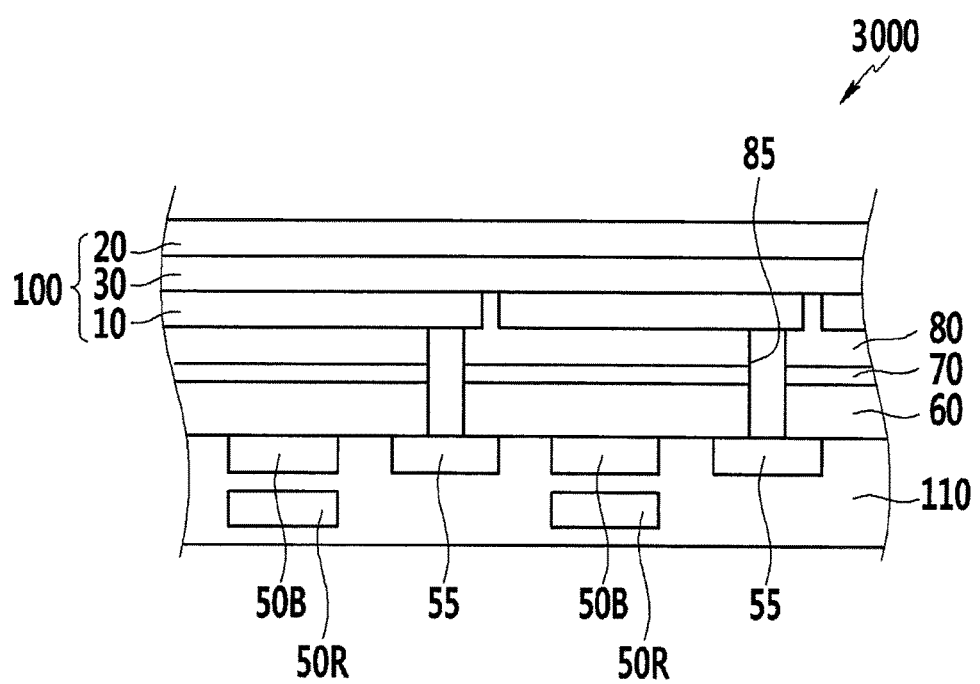
FIG. 9 is a cross-sectional view showing a CMOS image sensor according to example embodiments.

FIG. 9 is a schematic cross-sectional view showing a CMOS image sensor according to example embodiments Referring to FIG. 9, the image sensor 3000 according to example embodiments includes a semiconductor substrate 110, a nanopattern layer 70 positioned on the semiconductor substrate 110, and the organic photoelectronic device 100 positioned on the nanopattern layer 70, like the example embodiment illustrated in FIG. 8.

The semiconductor substrate 110 may be a silicon substrate, for example, a monocrystalline silicon substrate. The semiconductor substrate 110 is integrated with a blue photo-sensing device 50B, a red photo-sensing device 50R, a charge storage device 55, and a transmission transistor (not shown). The blue photo-sensing device 50B and the red photo-sensing device 50R may be photodiodes.

However, the image sensor 3000 according to example embodiments includes the blue photo-sensing device 50B and red photo-sensing device 50R are stacked with each other, unlike the example embodiment illustrated in FIG. 8. The blue photo-sensing device 50B and the red photo-sensing device 50R are electrically connected with the charge storage device (not shown), and may be transferred by a transmission transistor.

As aforementioned, an organic photoelectronic device selectively absorbing light in a green wavelength region has a stacked structure, and since the red photo-sensing device and the blue photo-sensing device are stacked, the size of an image sensor may be decreased, and thus crosstalk due to thickness increase of the image sensor may be decreased. In addition, as described above, light in a green wavelength region is reflected toward the organic photoelectric conversion layer 30 due to generation of interference according to introduction of the nanopattern layer 70, and thus the green light absorption rate of the organic photoelectric conversion layer 30 may be further increased.

The aforementioned image sensor has a nanopattern layer having a given (or alternatively, predetermined) pattern size on the semiconductor substrate and thus may selectively pass and reflect light in a particular wavelength region, and has relatively high color separation characteristics without having a separate organic color filter layer and may increase a light absorption rate of the organic photoelectric conversion layer, and thus photoelectric efficiency. In addition, an image sensor has a smaller thickness and may secure characteristics of concentrating light without a separate microlens.

The image sensor may be applied to various electronic devices, for example, a mobile phone, a digital camera, and a biosensor, without limitation.

Hereinafter, the present disclosure is illustrated in more detail with reference to examples. However, these are examples, and the present disclosure is not limited thereto.

Evaluation of Wavelength Selectivity

Example 1

Wavelength selectivity of an image sensor manufactured by applying a nanopattern layer according to example embodiments is evaluated through an optical simulation.

The optical simulation is calculated in a finite-difference time-domain (FDTD) method by using the Lumerical FDTD Solutions program.

Figure 10:
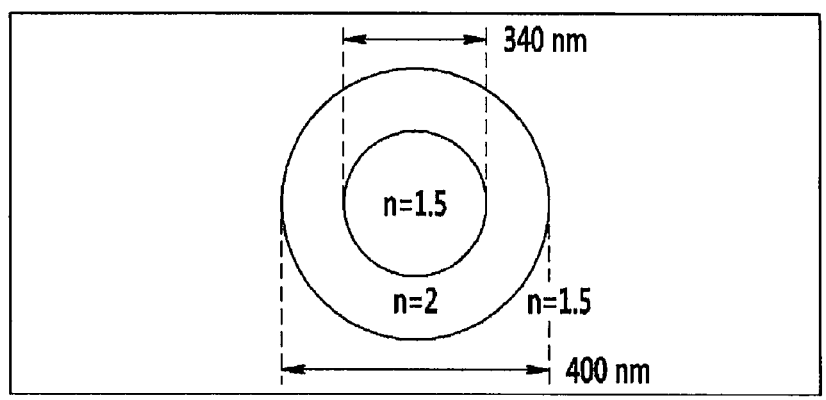
FIG. 10 is a cross-sectional view showing a part of the nanopattern layer according to Example 1, FIGS. 11(a) and (b) show a blue electric field distribution chart (a) and a red electric field distribution chart (b) in a silicon (Si) photodiode including the nanopattern layer of Example 1 thereon.

FIG. 10 is a cross-sectional view partially showing a part of the nanopattern layer according to example embodiments.

Referring to FIG. 10, the nanopattern layer according to example embodiments has a circular ring-shaped pattern, an area corresponding to the circular ring is formed of a dielectric substance having a refractive index (n)=2, while the rest of an area except for the ring is formed of a dielectric substance having a refractive index (n)=1.5, and an outer ring of the circular ring has a diameter of 400 nm, while an inner ring of the circular ring has a diameter of 340 nm.

Figure 11A:
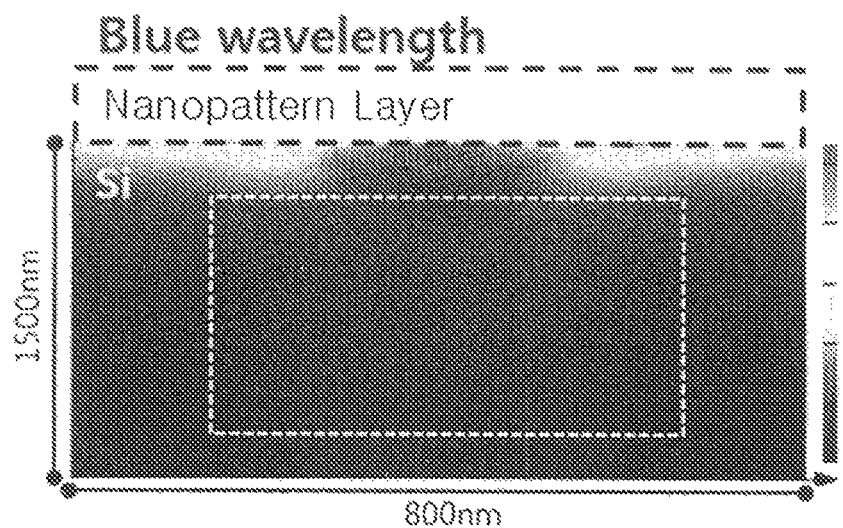
Figure 11B:
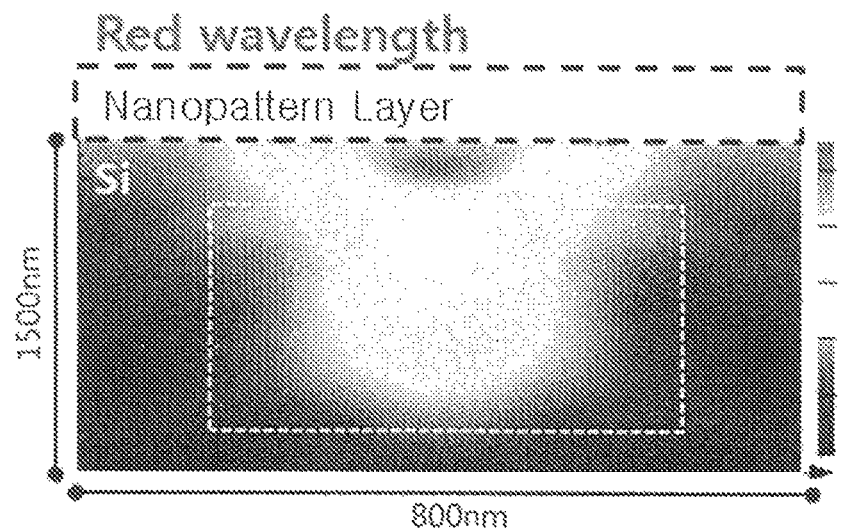

FIGS. 11(*a*) and 11(*b*) show a blue electric field distribution chart (FIG. 11(*a*)) and a red electric field distribution chart (FIG. 11(*b*)) in a silicon (Si) photodiode manufactured by introducing the nanopattern layer according to example embodiments thereon. Referring to FIGS. 11(*a*) and (*b*), a horizontal axis indicates pixel size (800 nm) of the silicon (Si) photodiode, while a vertical axis indicates thickness (1500 nm) of the silicon (Si) photodiode, and the nanopattern layer shown in FIG. 10 is positioned on the silicon (Si) photodiode.

Referring to FIGS. 11(*a*) and (*b*), the silicon (Si) photodiode including the nanopattern layer having a nanopattern of a given (or alternatively, predetermined) size thereon turns out to have wavelength selectivity about a blue wavelength region without having an organic color filter.

Example 2

Wavelength selectivity of an image sensor manufactured by applying a nanopattern layer according to example embodiments is evaluated through an optical simulation.

The optical simulation is performed by using the same program used in Example 1.

Figure 12:
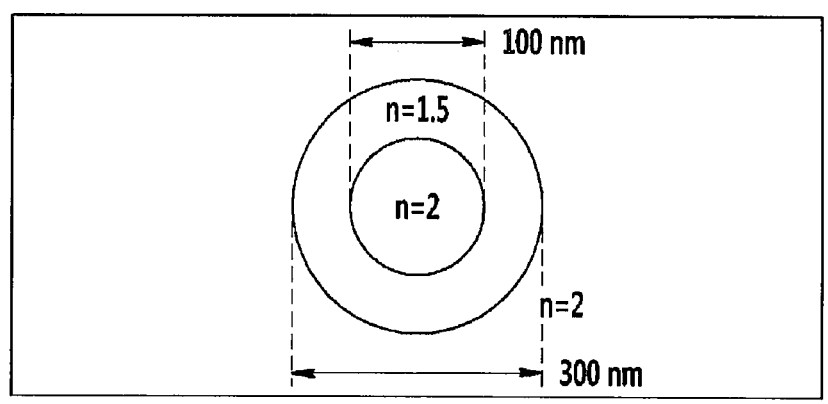
FIG. 12 is a cross-sectional view showing a part of the nanopattern layer according to Example 2, and FIGS. 13(a) and (b) show a blue electric field distribution chart (a) and a red electric field distribution chart (b) in a silicon (Si) photodiode including the nanopattern layer of Example 2 thereon.

FIG. 12 is a cross-sectional view showing a part of the nanopattern layer according to example embodiments.

Referring to FIG. 12, the nanopattern layer according to example embodiments has a circular ring-shaped pattern, an area corresponding to the circular ring is formed of a dielectric substance having a refractive index (n)=1.5, while the rest of an area except for the ring is formed of a dielectric substance having a refractive index (n)=2, and an outer ring of the circular ring has a diameter of 300 nm, while an inner ring of the circular ring has a diameter of 100 nm.

Figure 13A:
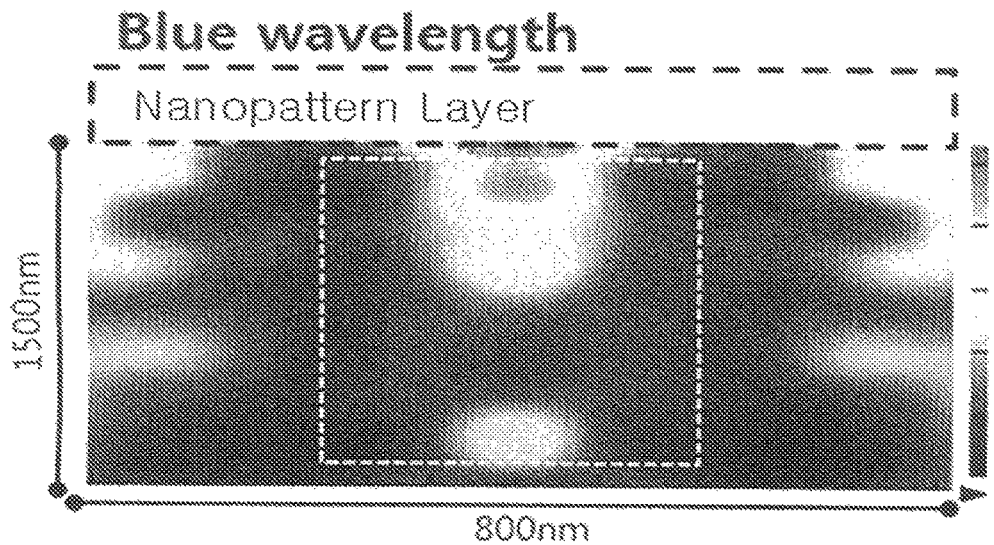
Figure 13B:
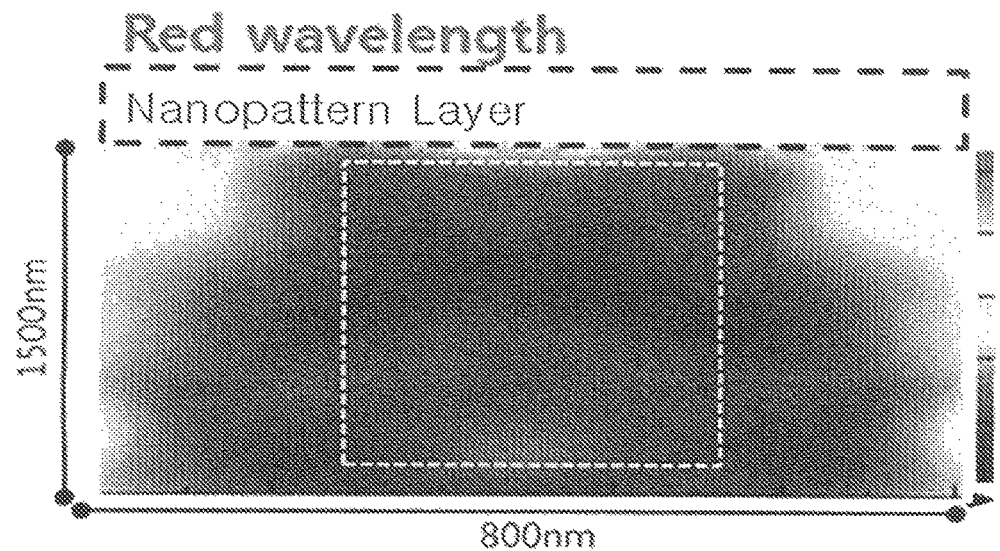

FIGS. 13(*a*) and 13(*b*) shows a blue electric field distribution chart (FIG. 13(*a*)) and a red electric field distribution chart (FIG. 13(*b*)) in a silicon (Si) photodiode manufactured by introducing the nanopattern layer according to example embodiments thereon. Referring to FIGS. 13(*a*) and 13(*b*), a horizontal axis indicates pixel size (800 nm) of the silicon (Si) photodiode, while a vertical axis indicates thickness (1500 nm) of the silicon (Si) photodiode, and the nanopattern layer shown in FIG. 12 is positioned on the silicon (Si) photodiode.

Referring to FIGS. 13(*a*) and 13(*b*), the silicon (Si) photodiode including the nanopattern layer having a nanopattern of a given (or alternatively, predetermined) size thereon turns out to have wavelength selectivity about a blue wavelength region without having an organic color filter.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:
1. An image sensor, comprising:
a semiconductor substrate integrated with a plurality of photo-sensing devices; and
a nanopattern layer on the semiconductor substrate, the nanopattern layer having a plurality of nanopatterns,
wherein each nanopattern of the plurality of nanopatterns corresponds one to one with a corresponding photo-sensing device of the plurality of photo-sensing devices, respectively,
wherein a single nanopattern of the plurality of nanopatterns corresponds to a single photo-sensing device of the plurality of photo-sensing devices,
wherein the single nanopattern and the single photo-sensing device have substantially a same width,
wherein the plurality of photo-sensing devices integrated in the semiconductor substrate include a first photo-sensing device configured to sense light in a first wavelength region and a second photo-sensing device configured to sense light in a second wavelength region that is different from the first wavelength region, and
wherein a size of the nanopattern corresponding to the first photo-sensing device is different from the size of the nanopattern corresponding to the second photo-sensing device.
2. The image sensor of claim 1, wherein each nanopattern of the plurality of nanopatterns transmits light in a wavelength region sensed by the single photo-sensing device corresponding thereto.
3. The image sensor of claim 1, wherein each nanopattern of the plurality of nanopatterns has a size greater than or equal to about 100 nanometers and less than about 1 micrometer.
4. The image sensor of claim 1, wherein the nanopattern layer includes at least two types of dielectric substances having different refractive indexes from each other.
5. The image sensor of claim 4, wherein
the two types of dielectric substances are formed in separate regions from each other, and
each nanopattern of the plurality of nanopatterns is defined at an interface between the two types of dielectric substances.
6. The image sensor of claim 4, wherein the two types of dielectric substances have a refractive index difference of greater than or equal to about 0.2.
7. The image sensor of claim 1, wherein the nanopattern layer has a thickness of less than about 1 micrometer.
8. The image sensor of claim 1, further comprising:
an organic photoelectronic device on the nanopattern layer, the organic photoelectronic device including,
a first electrode and a second electrode facing each other, and
an organic photoelectric conversion layer between the first electrode and the second electrode.
9. The image sensor of claim 8, wherein the organic photoelectric conversion layer absorbs light in a third wavelength region different from the first wavelength region and the second wavelength region.
10. The image sensor of claim 1, wherein
the first photo-sensing device and the second photo-sensing device are spaced apart from each other in a horizontal direction.
11. The image sensor of claim 10, wherein
the nanopattern corresponds to the first photo-sensing device selectively transmits light in a first wavelength region, and
the nanopattern corresponds to the second photo-sensing device selectively transmits light in a second wavelength region.
12. The image sensor of claim 9, wherein
the first wavelength region is a blue wavelength region,
the second wavelength region is a red wavelength region, and
the third wavelength region is a green wavelength region.
13. The image sensor of claim 12, wherein
the red wavelength region has a maximum absorption wavelength ($\lambda_{max}$) of greater than about 580 nanometers and less than or equal to about 700 nanometers,
the blue wavelength region has a maximum absorption wavelength ($\lambda_{max}$) of greater than or equal to about 400 nanometers and less than about 500 nanometers, and
the green wavelength region has a maximum absorption wavelength ($\lambda_{max}$) of about 500 nanometers to about 580 nanometers.
14. The image sensor of claim 1, wherein the first photo-sensing device and the second photo-sensing device are positioned at different depths from a surface of the semiconductor substrate.
15. The image sensor of claim 14, wherein
the first photo-sensing device senses light in a longer wavelength region than the second photo-sensing device, and
the first photo-sensing device is further from the surface of the semiconductor substrate than the second photo-sensing device.
16. The image sensor of claim 1, wherein the first photo-sensing device and the second photo-sensing device are sequentially stacked in a vertical direction.
17. The image sensor of claim 9, wherein the plurality of nanopatterns selectively reflects light in the third wavelength region to the organic photoelectric conversion layer.
18. An electronic device comprising the image sensor of claim 1.
19. The image sensor of claim 8, wherein the organic photoelectric conversion layer includes a p-type semiconductor and an n-type semiconductor, and
the p-type semiconductor and the n-type semiconductor form a pn junction.
20. The image sensor of claim 1, wherein the image sensor does not include an organic color filter.
21. An electronic device, comprising:
a nanopattern layer including a plurality of nanopatterns,
the plurality of nanopatterns being defined by a plurality of interfaces between a plurality of dielectric layers that have different refractive indexes,
the plurality of nanopatterns including a first nanopattern and a second nanopattern that are spaced apart from each other,
the first nanopattern being configured to transmit a first wavelength region of light, and
the second nanopattern being configured to transmit a second wavelength region of light that is different than the first wavelength region of light.
22. The electronic device of claim 21, wherein
the plurality of dielectric layers include a first dielectric layer and a second dielectric layer,
the first nanopattern is defined by a first interface between the first dielectric layer and the second dielectric layer,
the second nanopattern is defined by a second interface between the first dielectric layer and the second dielectric layer, and
the plurality of interfaces includes the first interface and the second interface, and a difference between a refractive index of the first dielectric layer and a refractive index of the second dielectric layer is greater than or equal to about 0.2.

23. The electronic device of claim 22, wherein
the second dielectric layer defines a through-hole in the nanopattern layer, and
the through-hole is between the first nanopattern and the second nanopattern.

24. The electronic device of claim 22, wherein
the second dielectric layer includes an inner region spaced apart from an outer region, and
the first interface between the first dielectric layer and second dielectric layer is defined by a portion of the first dielectric layer between the inner region of the second dielectric layer and the outer region of the second dielectric layer.

25. The electronic device of claim 22, wherein
the plurality of nanopatterns include a third nanopattern configured to transmit a third wavelength region of light that is different than the first wavelength region of light and the second wavelength region of light,
the third nanopattern is defined by a third interface between the first dielectric layer and the second dielectric layer,
the third nanopattern is spaced apart from the second nanopattern,
the first dielectric layer includes a first portion having a first size, a second portion having a second size, and a third portion having a third size,
the first portion of the first dielectric layer, the second portion of the first dielectric layer, and the third portion of the first dielectric layer are spaced apart from each other, and
the second dielectric layer surrounds the first portion of the first dielectric layer to the third portion of the first dielectric layer to define the first interface to the third interface.

* * * * *